(12) United States Patent
Lin et al.

(10) Patent No.: US 7,622,358 B2
(45) Date of Patent: Nov. 24, 2009

(54) SEMICONDUCTOR DEVICE WITH SEMI-INSULATING SUBSTRATE PORTIONS AND METHOD FOR FORMING THE SAME

(75) Inventors: Wen-Chin Lin, Hsin-Chu (TW); Denny Tang, Saratoga, CA (US); Chuan-Ying Lee, Hsinchu (TW); Hsu Chen Cheng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/241,574

(22) Filed: Sep. 30, 2005

(65) Prior Publication Data

US 2007/0077697 A1 Apr. 5, 2007

(51) Int. Cl.
*H01L 21/76* (2006.01)
(52) U.S. Cl. .................. 438/400; 438/197; 438/700; 257/E21.58; 257/E21.4; 257/E21.55; 257/E21.231; 257/E21.248; 257/E21.314
(58) Field of Classification Search .......... 438/199, 438/514, 517, 761, 764, 766, 942, 961, FOR. 145, 438/FOR. 393, 400, 197, 297, 149, 637, 618, 438/700
See application file for complete search history.

(56) References Cited

U.S. PATENT DOCUMENTS

| | | | | |
|---|---|---|---|---|
| 4,244,097 A | * | 1/1981 | Cleary | 438/181 |
| 4,474,623 A | * | 10/1984 | Adlerstein | 438/412 |
| 5,515,471 A | * | 5/1996 | Yamamoto et al. | 385/122 |
| 5,914,499 A | * | 6/1999 | Hermansson et al. | 257/77 |
| 6,046,109 A | | 4/2000 | Liao et al. | |
| 7,071,478 B2 | * | 7/2006 | Lin et al. | 250/492.22 |
| 2002/0077485 A1 | * | 6/2002 | Avrutov | 548/248 |
| 2004/0082138 A1 | * | 4/2004 | Wen-Chin et al. | 438/400 |
| 2005/0077485 A1 | * | 4/2005 | Wang et al. | 250/492.2 |
| 2005/0133477 A1 | * | 6/2005 | Esseian | 216/24 |
| 2005/0164476 A1 | * | 7/2005 | Schulze et al. | 438/515 |
| 2006/0172547 A1 | * | 8/2006 | Furukawa et al. | 438/725 |

FOREIGN PATENT DOCUMENTS

TW 447000 7/2001

OTHER PUBLICATIONS

Tang et al., "The Integration of Proton Bombardment Process into the manufacturing of Mixed-signal/RF Chips", 2003 IEEE, IEDM, pp. 673-676.

* cited by examiner

*Primary Examiner*—David Nhu
(74) *Attorney, Agent, or Firm*—Duane Morris LLP

(57) ABSTRACT

A method for forming semi-insulating portions in a semiconductor substrate provides depositing a hardmask film over a semiconductor substructure to a thickness sufficient to prevent charged particles from passing through the hardmask. The hardmask is patterned creating openings through which charged particles pass and enter the substrate during an implantation process. The semi-insulating portions may extend deep into the semiconductor substrate and electrically insulate devices formed on opposed sides of the semi-insulating portions. The charged particles may advantageously be protons and further substrate portions covered by the patterned hardmask film are substantially free of the charged particles.

15 Claims, 2 Drawing Sheets

SEMICONDUCTOR DEVICE WITH SEMI-INSULATING SUBSTRATE PORTIONS AND METHOD FOR FORMING THE SAME

FIELD OF THE INVENTION

The invention relates to the general field of integrated circuits with particular reference to the formation of semi-insulating regions therein.

BACKGROUND

The need often arises in integrated circuits (ICs) to electrically isolate various regions from one another. At the digital device level, a number of techniques are known and used to produce this electrical isolation, such as LOCOS (local oxidation of silicon) and STI (shallow trench isolation). These techniques insure good electrical isolation of various regions from one another but undesirably require time consuming processing operations and consume significant real estate on the wafer surface. Another shortcoming of these techniques is that they are useful only for regions that are relatively close to the wafer surface. There are a number of situations, however, where the isolating region must extend to a significant depth below the wafer surface. In some cases, the isolating region must extend completely through to the opposed surface of the wafer. Examples that require deep substrate isolation regions include reduction of substrate noise coupling, realization of high Q inductors on silicon mixed mode ICs, reduction of transmission line loss for high frequency ICs, and the separation of different types of devices such as analog from digital or bipolar from CMOS on the same substrate.

One method for forming electrically isolating regions in silicon and other conventionally used semiconductor substrates, includes implanting charged particles such as protons, into the semiconductor substrate to convert the semiconductor substrate to a semi-insulating or high-resistance region. There are some known methods for implanting protons deep into the semiconductor substrates to form electrically isolating regions, but these techniques utilize a further mask that must be positioned above the surface of the substrate and aligned with great precision to the structures formed on a substrate. This procedure is cumbersome and time consuming. In some cases, to improve alignment precision, the further mask such as a Si-mask-wafer, is physically attached to the substrate upon which the IC is being fabricated. Physically contacting the mask to the substrate may scratch and damage the surface of the substrate causing yield reduction and device failure.

It would therefore be desirable to provide a method for forming deep electrically isolating areas in a semiconductor substrate sufficient to accommodate the aforementioned needs, and without having to align a remote mask with the substrate or contacting the further mask to the substrate and damaging the surface.

SUMMARY OF THE INVENTION

To address these and other needs, and in view of its purposes, the present invention provides a method for forming a semi-insulating region in a semiconductor substrate. The method includes providing an unpassivated semiconductor substructure including at least some semiconductor devices formed in and on a semiconductor substrate, depositing and patterning a hardmask film over the semiconductor substructure to produce a patterned hardmask with openings in the pattern. The method then includes implanting charged particles into substrate portions that are disposed beneath the openings using conditions sufficient to render the substrate portions semi-insulating, while the thickness of the hardmask film is sufficient to prevent the charged particles from passing through the hardmask film insuring that further substrate portions under the patterned hardmask film are substantially free of charged particles.

In another aspect, provided is a method for forming a semi-insulating region in a semiconductor substrate. The method comprises providing an unpassivated semiconductor substructure including at least a semiconductor device formed at least one of in and on a semiconductor substrate, depositing and patterning a hardmask film overlying the semiconductor substructure thereby producing a patterned hardmask film with at least one opening, and implanting charged particles into the semiconductor substrate beneath the opening to form at least one semi-insulating region in a first portion of the semiconductor substrate. A second portion of the semiconductor substrate under the patterned hardmask film is substantially free of the charged particles, which are protons.

In another aspect, the invention provides a semiconductor product with semi-insulating portions. The semiconductor product includes an unpassivated semiconductor substructure including a semiconductor substrate with semiconductor devices formed at least one of therein and thereon, a patterned hardmask formed over the substrate and the semiconductor devices and including protons as dopant impurities therein. The semiconductor product also includes semi-insulating portions of the semiconductor substrate beneath openings in the patterned hardmask, the semi-insulating portions doped with protons as dopant impurities therein. Further portions of the semiconductor substrate under the patterned hardmask are substantially free of protons. The semi-insulating portions may include a resistivity within the range of 5E2 ohm-cm to 5E7 ohm-cm.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The present invention provides for the formation of semi-insulating or high resistance portions in a semiconductor substrate. More particularly, the invention provides for converting portions of a semiconductor substrate to semi-insulating or high-resistive materials. By semi-insulating or high resistance materials, it is meant that the material has a resistivity generally between 5E2 to 5E7 ohm-cm, but other resistivity values sufficient to electrically insulate components or devices from one another, may be used. The invention provides for the formation of deep semi-insulating structures that extend deep into the substrate, or even completely through the substrate. The semi-insulating structures may be used to electrically isolate portions of an integrated circuit such as analog portions and digital portions, from one another and additionally or alternatively to reduce substrate noise coupling, realize high-Q inductors on silicon mixed mode IC's, reduce transmission line loss for high frequency integrated circuits, and the like.

Figure 1:
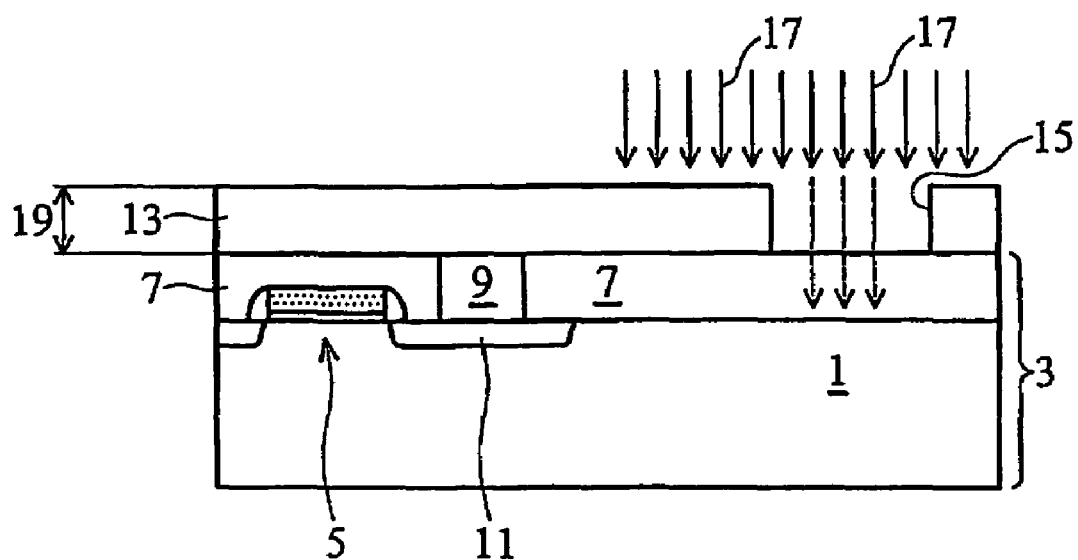
FIG. 1 is a cross-sectional view showing an exemplary semiconductor substructure being implanted according to an aspect of the invention.

FIG. 1 is a cross-sectional view showing a patterned hardmask film formed over a semiconductor substructure. Semiconductor substructure 3 includes semiconductor substrate 1 which may be silicon, silicon/germanium, indium phosphide, gallium nitride, silicon carbide, or other suitable semiconductive materials. Substrate 1 shown FIG. 1 is also known as a wafer and wafers of various diameters may be used. Semiconductor substructure 3 includes semiconductor device 5, parts of which are formed in and on semiconductor substrate 1. Semiconductor device 5 is an MOS transistor in the illustrated embodiment but semiconductor substructure 3 may alternatively or additionally include other devices such as capacitors, resistors, thin film transistors (TFTs), laser structures, VSCELs (vertical cavity surface emitting lasers), OLEDs (organic light emitting diodes) or various other unmetalized semiconductor structures. Semiconductor substructure 3 including semiconductor device 5 has not yet been passivated, i.e. a passivation film has not yet been formed thereover. In various embodiments, semiconductor substructure 3 will also not have yet been metalized, i.e., conductive interconnect devices will have not yet been formed on substrate 1. Dielectric layer 7 is formed over semiconductor substrate 1. Within an opening in dielectric 7, plug 9 is used to provide contact to subjacent structures such as source/drain region 11. Plug 9 may be formed of a polysilicon lead, a tungsten or other plug or various other non-metal materials.

Hardmask 13 is a film that is deposited on semiconductor substructure 3. Conventional deposition methods may be used. Hardmask 13 is removable and may be formed of at least one of the following components: tantalum (Ta), aluminum (Al), titanium (Ti), tungsten (W), tantalum nitride (TaN), silicon (Si), nickel (Ni) and gold (Au). Hardmask 13 is formed to a thickness 19 that is chosen in conjunction with the material used for hardmask film 13 and the characteristics of the implantation process used to introduce charged particles into semiconductor substructure 3 and semiconductor substrate 1. Thickness 19 may vary for different materials. For example, the following are exemplary minimal thicknesses for hardmask film 13 when it is formed of the following materials: silicon ($\geq 400$ microns); aluminum ($\geq 400$ microns); nickel ($\geq 150$ microns); tungsten ($\geq 125$ microns); and gold ($\geq 125$ microns). Other thickness may be used in other exemplary embodiments, however. Thickness 19 is chosen to ensure that the charged particles being implanted into semiconductor substrate 1, do not pass through hardmask 13 and into underlying semiconductor substructure 3. Opening 15 is formed in hardmask film 13 using conventional patterning methods that produce a hardmask pattern with openings such as exemplary opening 15 within the pattern. Openings 15 are formed over substrate regions that are to receive the charged particle implant and become semi-insulating regions.

The charged particle implant is indicated by arrows 17. The implantation process is carried out over the entire wafer. Arrows 17 are only shown over a part of the illustrated structure for added clarity in pointing out further features of the structure on the left-hand side of the figure. The charged particle implant may implant protons in order to convert the implanted portions of semiconductor substrate 1 to the semi-insulating material. Conventional charged particle implantation methods may be used. The energy of the charged particles may vary from 0.5 to 5 MeV but other energies may be used in other exemplary embodiments. The fluence of the particles being implanted may range from $1 \times 10^{12}$ ea/cm$^2$ to $1 \times 10^{17}$ ea/cm$^2$ but other fluences may be used in other exemplary embodiments. Various other suitable implant conditions may be used The charged particles enter semiconductor substrate 1 through openings 15 in hardmask 13 as indicated by the dashed arrows, but do not extend through hardmask 13.

Figure 2:
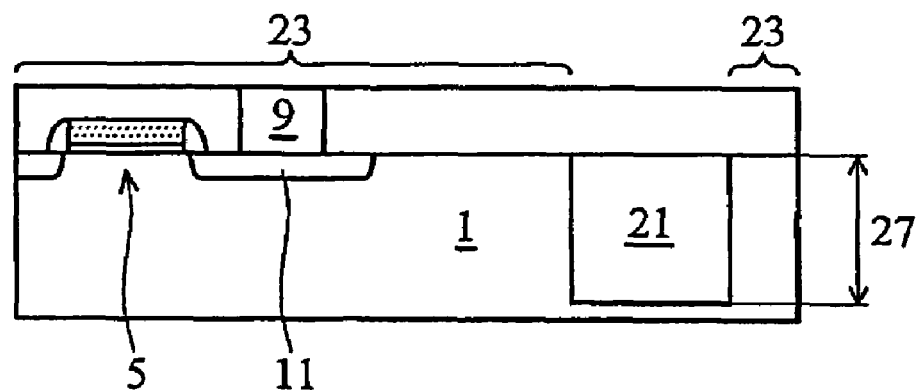
FIG. 2 is a cross-sectional view showing the exemplary substructure of FIG. 1 after the hardmask has been removed and illustrating the semi-insulating portion of the substrate.

Now turning to FIG. 2, it can be seen that hardmask 13 has been removed and semi-insulating substrate portion 21 created as a result of the implantation process illustrated in FIG. 1 that introduces protons or other charged particles into semiconductor substrate 1. Conventional methods may be used to selectively remove hardmask 13 without substantially damaging the structure beneath hardmask 13. Semi-insulating substrate portion 21 may have a resistivity between $5 \times 10^2$ to $5 \times 10^7$ ohm-cm in one exemplary embodiment but may include various other resistivities in other exemplary embodiments, the resistivity sufficient to electrically isolate other substrate portions 23 from one another. In one exemplary embodiment, substrate portions 23 may include an analog portion and a digital portion electrically insulated by semi-insulating substrate portion 21. Semi-insulating substrate portion 21 may extend to a depth 27 that may be as great as 5 um to 500 um in various exemplary embodiments. In semi-insulating substrate region 21, original semiconductor substrate 1 has been converted to a semi-insulating or highly resistive material.

Figure 3:
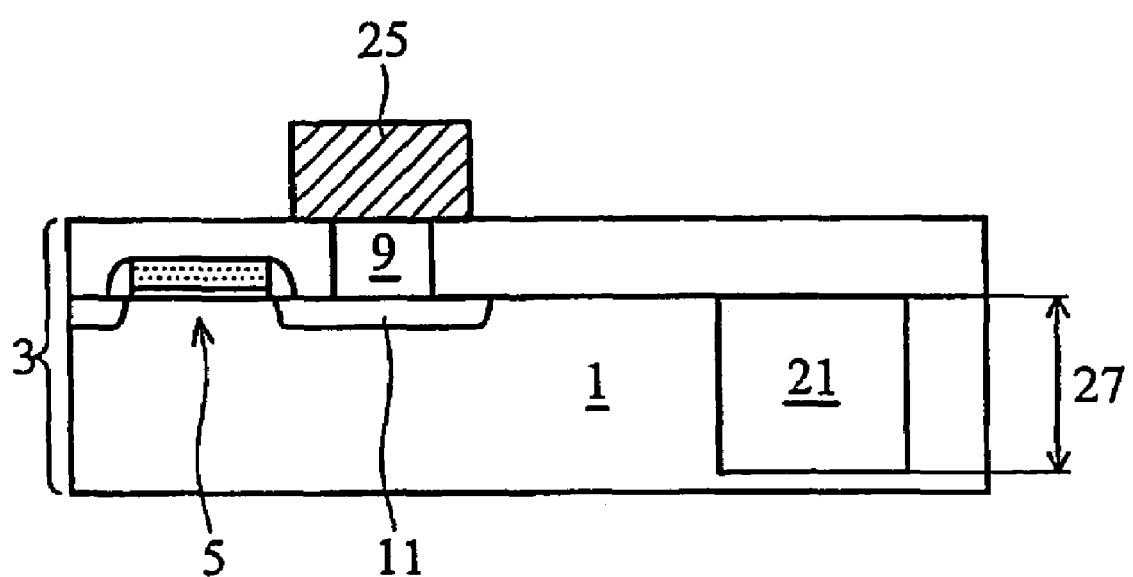
FIG. 3 is a cross-sectional view showing the structure of FIG. 2 after formation of an interconnect structure.

FIG. 3 shows the structure of FIG. 2 after conductive lead 25 has been formed over semiconductor substructure 3. Various suitable methods and various suitable metal materials may be used to form conductive lead 25. Conductive lead (interconnect lead) 25 may be a damascene structure in other exemplary embodiments. Various processing operations are then carried out on the structure shown in FIG. 3 to produce a finished integrated circuit or other semiconductor device or product.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" should be construed to refer to the orientation as then described or as shown in the drawing under discussion. These relative terms are for convenience of description and relative position do not require that the structure be constructed in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semi-insulating region in a semiconductor substrate comprising:
   providing an unpassivated semiconductor substructure including at least a semiconductor device formed at least one of in and directly on said semiconductor substrate;
   depositing and patterning a hardmask film on and directly contacting said semiconductor substructure thereby producing a patterned hardmask film with at least one opening; and
   implanting charged particles into said semiconductor substrate beneath said opening to form at least one semi-insulating region in a first portion of said semiconductor substrate, wherein a second portion of said semiconductor substrate under said patterned hardmask film is substantially free of said charged particles,
   wherein said charged particles comprise protons.

2. The method for forming a semi-insulating region in a semiconductor substrate according to claim 1, wherein said implanting comprises an energy of about 0.5 MeV to 5 MeV.

3. The method for forming a semi-insulating region in a semiconductor substrate according to claim 1, wherein said implanting has a fluence of $1\times10^{12}$ ea/cm$^2$ to $1\times10^{17}$ ea/cm$^2$.

4. The method for forming a semi-insulating region in a semiconductor substrate according to claim 1, further comprising removing said patterned hardmask film after said implanting.

5. The method for forming a semi-insulating region in a semiconductor substrate according to claim 4, wherein said providing includes said semiconductor substructure being unmetalized and further comprising forming metallic interconnect structures on said semiconductor substructure after said removing.

6. The method for forming a semi-insulating region in a semiconductor substrate according to claim 1, wherein said at least a semiconductor device is under said patterned hardmask film during said implanting.

7. The method for forming a semi-insulating region in a semiconductor substrate according to claim 1, wherein said second portion of said semiconductor substrate comprises at least one analog portion and at least one digital portion, and semi-insulating region is disposed between said analog portion and said digital portion.

8. The method for forming a semi-insulating region in a semiconductor substrate according to claim 1, wherein said semi-insulating region has a resistivity within a range of 5E2 ohm-cm to 5E7 ohm-cm.

9. The method for forming a semi-insulating region in a semiconductor substrate according to claim 1, wherein said hardmask film comprises at least one of Si, Ta, Al, Ti, W, Ni, TaN, Au, and alloys thereof.

10. The method for forming a semi-insulating region in a semiconductor substrate according to claim 1, wherein said depositing and patterning a hardmask film over said semiconductor substructure comprises forming said hardmask film directly on said semiconductor substructure.

11. The method for forming a semi-insulating region in a semiconductor substrate according to claim 1, wherein said implanting comprises implanting said charged particles to a depth of 5 um to 500 um within said semiconductor substrate.

12. A method for forming a semi-insulating region in a semiconductor substrate comprising:
    providing an unpassivated semiconductor substructure including at least a semiconductor device formed at least one of in and directly on said semiconductor substrate;
    depositing and patterning a hardmask film on and directly contacting said semiconductor substructure thereby producing a patterned hardmask with openings therebetween; and
    implanting charged particles into portions of said semiconductor substrate beneath said openings using conditions sufficient to render said portions semi-insulating while a thickness of said patterned hardmask is sufficient to prevent said charged particles from passing through said hardmask film such that further portions of said semiconductor substrate under said patterned hardmask film are substantially free of said charged particles.

13. The method for forming a semi-insulating region in a semiconductor substrate according to claim 12, wherein said further substrate portions include at least one analog portion and at least one digital portion and said substrate portions include at least one substrate portion directly disposed between one of said analog portions and one of said digital portions.

14. The method for forming a semi-insulating region in a semiconductor substrate according to claim 12, wherein said implanting charged particles into substrate portions beneath said openings comprises forming said substrate portions to have a resistivity within a range of 5E2 ohm-cm to 5E7 ohm-cm.

15. A method for forming a semi-insulating region in a semiconductor substrate comprising:
    providing an unpassivated semiconductor substructure including at least a semiconductor device formed at least one of in and on said semiconductor substrate;
    depositing a hardmask film to adhere to said semiconductor substrate, said hardmask film overlying and at least indirectly contacting said semiconductor substructure, then patterning said hardmask film thereby producing a patterned hardmask film with at least one opening;
    implanting charged particles into said semiconductor substrate beneath said opening to form at least one semi-insulating region in a first portion of said semiconductor substrate, wherein a second portion of said semiconductor substrate under said patterned hardmask film is substantially free of said charged particles; and,
    removing said patterned hardmask film after said implanting,
    wherein said charged particles comprise protons.

* * * * *